US005493616A

United States Patent [19]

Iidaka et al.

[11] Patent Number: 5,493,616

[45] Date of Patent: Feb. 20, 1996

[54] VEHICLE INTERNAL NOISE REDUCTION SYSTEM

[75] Inventors: Hiroshi Iidaka, Tokyo; Eiji Shibata, Gunma; Manpei Tamamura, Ohta, all of Japan

[73] Assignee: Fuji Jukogyo Kabushiki Kaisha, Tokyo, Japan

[21] Appl. No.: 214,489

[22] Filed: Mar. 18, 1994

[30] Foreign Application Priority Data

Mar. 29, 1993 [JP] Japan .................................... 5-070252

[51] Int. Cl.[6] ............................ H03B 29/00; A61F 11/06

[52] U.S. Cl. ................................................ 381/71; 381/94

[58] Field of Search ................................ 381/71, 94, 86, 381/73.1; 364/574, 581

[56] References Cited

U.S. PATENT DOCUMENTS

| | | | |
|---|---|---|---|
| 5,337,365 | 8/1994 | Hamabe et al. | 381/94 |
| 5,359,662 | 10/1994 | Yuan et al. | 381/71 |
| 5,384,853 | 1/1995 | Kinoshita et al. | 381/71 |
| 5,386,372 | 1/1995 | Kobayashi et al. | 364/574 |

*Primary Examiner*—Curtis Kuntz
*Assistant Examiner*—Xu Mei
*Attorney, Agent, or Firm*—Beveridge, DeGrandi, Weilacher & Young

[57] ABSTRACT

The vehicle internal noise reduction system is characterized in being able to attenuate the internal noise sounds at a broad area of the passenger compartment by generating optimum canceling sounds from speakers disposed in the passenger compartment under any operating conditions.

19 Claims, 6 Drawing Sheets

(a) FREQUENCY CHARACTERISTIC A OF FILTER CIRCUIT (b) FREQUENCY CHARACTERISTIC B OF FILTER CIRCUIT (a) RESULT OF NOISE REDUCTION ACCORDING TO PRESENT INVENTION (b) RESULT OF NOISE REDUCTION ACCORDING TO PRIOR ART

VEHICLE INTERNAL NOISE REDUCTION SYSTEM

BACKGROUND OF THE INVENTION

The present invention relates to a noise reduction system for a passenger compartment of an automotive vehicle by positively generating sounds from a plurality of sound sources to cancel the vehicle internal noise.

There have been proposed several techniques for reducing the noise sound in the passenger compartment by producing a canceling sound from a sound source disposed in the passenger compartment. The canceling sound has the same amplitude as the noise sound, but has a reversed phase thereto.

As a recent example, Japanese application laid open No. 1991-204354 discloses a vehicle internal noise reduction technique for reducing a noise sound by using a LMS (Least Means Square) algorithm (a theory for obtaining a filter coefficient by approximating it to a means square error in order to simplify a formula, utilizing that a filter correction formula is a recursive expression) or by employing MEFX-LMS (Multiple Error Filtered X-LMS) algorithm. This technique has already been put to a practical use in some of vehicles. Commonly, an internal noise reduction system using this LMS algorithm is composed in such a way that: a vibration noise source signal (primary source) is detected from an engine, the primary source is synthesized with a filter coefficient of an adaptive filter into a canceling sound, the canceling sound is generated from a speaker to cancel a noise sound in the passenger compartment; the noise sound reduced by the canceling sound is detected as an error signal by a microphone disposed at a noise receiving point; and based on the detected error signal and a compensation signal synthesized with a predetermined coefficient a filter coefficient of the adaptive filter is updated by the LMS algorithm so as to optimize the reduced noise sound at the noise receiving point.

It is known that an effective way for reducing an internal noise sound by producing a canceling sound is to coincide the direction from which the canceling sound comes with the one from which a noise sound comes. That is to say, as indicated in FIG. 7 (*a*), (*b*), (*c*), (*d*) and (*e*), in case where the canceling sound comes from the same direction as the noise sound, both are canceled each other at any position, providing that a noise sound and a canceling sound are plane waves having the same amplitude, the same frequency and a reversed phase to each other. However, on the other hand, in case where the canceling sound comes from an opposite direction to the noise sound as shown in FIG. 8 (*a*), (*b*), (*c*), (*d*) and (*e*), the canceling sound cancels the noise sound at the position of n $\lambda/2$ (for example, positions $X_a$ and $X_b$), but at the position of (1+2n) $\lambda/4$ (for example, a position $X_c$, a mid-point of Xa and Xb) the noise sound is interfered with the canceling sound and as a result of this interference it is amplified on the contrary (a relationship of the standing wave), where n is an integer and $\lambda$ is a wave length. Especially, a noise reduction system using the LMS algorithm, among others, the MEFX-LMS algorithm has plural speakers from which canceling sounds are generated to cancel noise sounds at plural positions where a microphone is placed and plural independent control circuits for making control processes individually, therefore it happens that internal noise sounds changing rapidly according to operating conditions of the engine could be reduced at a position where a microphone is located but could not at other positions away from the microphone. Further, depending on an operational condition of the engine, the noise sounds may be amplified and get worse than in a case where no noise reduction control is performed.

Commonly, the position from which the internal noise sound is generated differs according to the frequency bands constituting the noise sound due to the difference of the transmission characteristics inherent to a vehicle. For example, the noise sound containing relatively high frequency bands (for example, 250 Hz to 500 Hz) is generated from the front of the vehicle, and the sound containing relatively low frequency bands from the whole passenger compartment.

SUMMARY OF THE INVENTION

The present invention has been made in order to solve the aforementioned problems. An object of the present invention is to provide an internal noise reduction system for a vehicle that can reduce noise sounds changing according to operational conditions of engine efficiently and has a broad coverage of areas where noise sounds are reduced in the passenger compartment.

To achieve the above object, the internal noise reduction system according to the present invention comprises a plurality of channels having: operational conditions detecting means for detecting the operating condition signal; compensation coefficients memory means for storing compensation coefficients; compensation coefficients selecting means responsive to the operating condition signal for selecting a compensation coefficient from among the compensation coefficients stored in the compensation coefficients memory means; input signal compensating means for synthesizing the vibration noise source signal with the compensation coefficient selected by the compensation coefficients selecting means; canceling signal synthesizing means for synthesizing the vibration noise source signal with a filter coefficient; filter characteristics memory means for storing predetermined filter characteristics; filter characteristics selecting means responsive to the operating condition signal for selecting a filter characteristic from among the filter characteristics stored in the characteristics memory means; processing means for processing the vibration noise source signal synthesized by the canceling signal synthesizing means with the filter characteristic and for outputting a canceling signal; canceling sound generating means responsive canceling signal for generating the canceling sounds from a speaker so as to cancel the noise sound within the passenger compartment; error signal detecting means for detecting a state of noise reduction by the canceling sounds and for generating an error signal; and filter coefficients updating means responsive to the error signal for calculating the filter coefficient based on the vibration noise source signal synthesized by the input signal compensating means and a preceding filter coefficient and for transmitting the filter coefficient to the canceling signal synthesizing means.

Next, based on the composition of means abovementioned, a brief description about a function of the noise reduction system according to the present invention will be made.

When a noise sound that is derived primarily from the engine is generated in the passenger compartment, in the plurality of canceling signal processing means the canceling signal processing circuit which is disposed at the input side of each of the canceling sound generating means is set to a required characteristic according to the position of a noise source. Further, in the compensation coefficients selecting means, the compensation coefficients are set to a required characteristic based on the above setting of characteristic in the canceling signal processing means. Next, in the canceling signal synthesizing means, the vibration noise source signal having a high correlation with the engine vibration is synthesized into a canceling signal by the adaptive filter and is outputted to the canceling signal processing circuit. Further, the vibration noise source signal is processed into a required characteristic in the canceling signal processing circuit and then outputted to the canceling sound generating means from which a canceling sound is generated to cancel the noise sound. Further, the state of noise reduction at the noise receiving point is detected as an error signal by the error signal detecting means and the error signal is transmitted to the filter coefficients updating means. On the other hand, the vibration noise source signal is inputted to the input signal compensating means and then is synthesized with a required compensation coefficient therein. The synthesized vibration noise source signal is transmitted to the filter coefficients updating means in which the filter coefficient of the adaptive filter is updated based on the signal from the input signal compensating means and the error signal.

BRIEF DESCRIPTION OF THE DRAWINGS

The present invention will be described hereinafter in connection with the accompanying drawings, in which:

FIG. 1 to FIG. 4 show a preferred embodiment according to the present invention, among them FIG. 1 illustrates a schematic view of an internal noise reduction system according to the present invention;

FIG. 2 is a schematic view of a signal processing circuit;

FIG. 3 is a conceptional illustration for explaining the filter characteristics stored in a memory;

FIG. 6 (*b*) is an illustration for showing the result of a noise reduction according to the prior art.

DESCRIPTION OF THE PREFERRED EMBODIMENT

Figure 1:
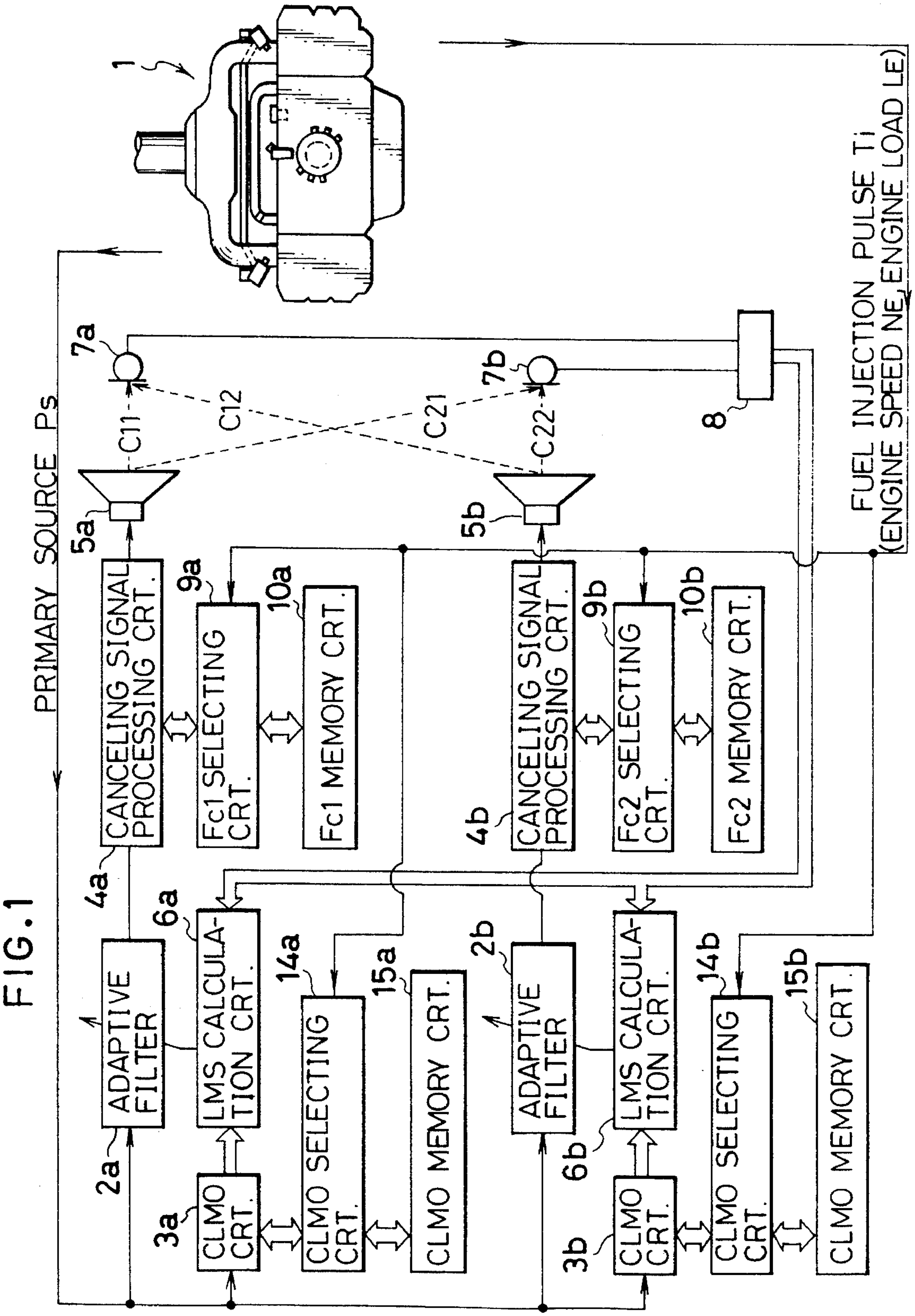

In FIG. 1, numeral 1 denotes an engine from which the vibration noise source signal (referred to as a primary source Ps, hereinafter) having a high correlation with the engine related vibration noise is generated. The primary source $P_s$ is inputted into adaptive filters 2*a* and 2*b* which are canceling signal synthesizing means and further inputted into compensation coefficients synthesizing circuits 3*a* and 3*b* (hereinafter referred to as $C_{LMO}$ circuit) which are input signal compensating means. The adaptive filter 2*a* is connected to a speaker 5*a* which is canceling sound generating means, disposed at the front side of the passenger compartment via a canceling signal processing circuit 4*a* and further the adaptive filter 2*b* is connected to a speaker 5*b* which is canceling sound generating means, disposed at the rear side of the passenger compartment via a canceling signal processing circuit 4*b*. Further, $C_{LMO}$ circuits 3*a* and 3*b* are connected to LMS calculating circuits 6*a* and 6*b* respectively which act as filter coefficient updating means described hereinafter.

At the front noise receiving point (for example, at a position adjacent to a driver's ears or a front passenger's ones), an error microphone 7*a* for detecting a noise reduction state as an error signal at the noise receiving point and at the rear noise receiving point (for example, at a position adjacent to a rear passenger's ears), an error microphone 7*b* for detecting a noise reduction state as an error signal at the noise receiving point are disposed respectively. These error microphones 7*a* and 7*b* are connected to the LMS calculating circuits 6*a* and 6*b* respectively via an error signal processing circuit 8.

For convenience of explanation, hereinafter, the speaker 5*a* of the front passenger compartment is designated as No. 1, the speaker 5*b* of the rear passenger compartment as No. 2, the error microphone 7*a* of the front passenger compartment as No. 1 and the error microphone 7*b* of the rear passenger compartment as No. 2.

It is necessary that the primary source $P_s$ has a high correlation with a vibration noise of the engine 1. As a primary source, therefore, signals synthesized and wave-shaped with ignition pulses, fuel injection pulses, signals from a crank angle sensor (not shown) or signals synthesized with these information and other engine loading information are used for this purpose.

Further, the adaptive filter 2*a* is a FIR (Finite Impulse Response) filter which has filter coefficients $W_{1(n)}$ updated by a LMS calculating circuit 6*a* and has a required number of taps (for example 512 taps) therein. The LMS calculation circuit acts as filter coefficients updating means. The primary source $P_s$ inputted to the adaptive filter 2*a* is subjected to the sum of convolution products with the filter coefficient $W_{1(n)}$ and outputted as a canceling signal. Similarly, the adaptive filter 2*b* is a FIR (Finite Impulse Response) filter which has a filter coefficient $W_{2(n)}$ updated by a LMS calculation circuit 6*b* and has a required number of taps (for example 512 taps) therein. The LMS calculation circuit acts as filter coefficients updating means. The primary source $P_s$ inputted to the adaptive filter 2*b* is subjected to the sum of convolution products with the filter coefficient $W_{2(n)}$ and outputted as a canceling signal.

Figure 2:
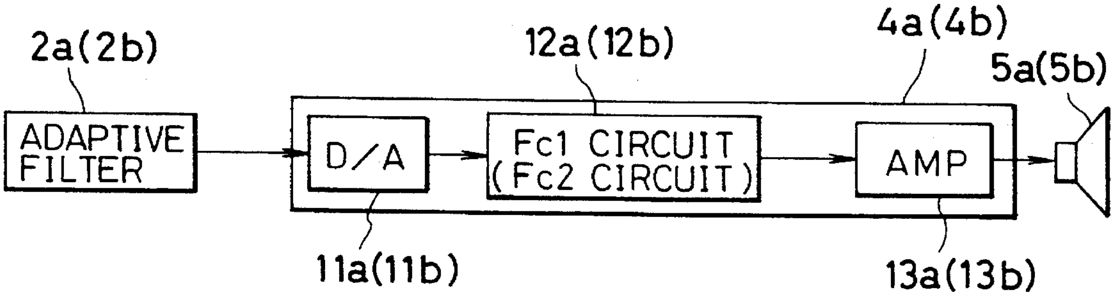

Referring to FIG. 2, the canceling signal processing circuit 4*a* to which the canceling signal is inputted from the adaptive filter 2*a* mainly comprises a D/A (digital to analogue) conversion circuit 11*a*, a filter circuit (hereinafter, referred to as a $F_{c1}$ circuit) 12*a* and an amplifier (AMP) circuit 13*a*. Also the canceling signal processing circuit 4*b* to which the canceling signal is inputted from the adaptive filter 2*b* similarly comprises a D/A conversion circuit 11*b*, a filter circuit (hereinafter, referred to as a $F_{c2}$ circuit) 12*b* and an AMP circuit 13*b*.

The $F_{c1}$ circuit 12*a* and the $F_{c2}$ circuit 12*b* are analogue filter circuits through which, correspondingly to the characteristics of the speakers 5*a* and 5*b* connected thereto, the wave-shaping of signals is performed and only particular frequency bands are permitted to be passed through. Also, these analogue filters are adjusted to the required frequency characteristic as described hereinafter according to the positions of noise sources.

Further, the $F_{c1}$ circuit 12a is connected with a $F_{c1}$ selecting circuit 9a which comprises canceling signal processing means and the $F_{c1}$ selecting circuit 9a is connected with a $F_{c1}$ memory circuit 10a which is a memory part of the canceling signal processing means. Similarly, the $F_{c2}$ circuit 12b is connected with a $F_{c2}$ selecting circuit 9b which comprises canceling signal processing means and the $F_{c2}$ selecting circuit 9b is connected with a $F_{c2}$ memory circuit 10b which is a memory part of the canceling signal processing means.

Further, a fuel injection pulse $T_i$ derived from the engine 1 is inputted to both of the $F_{c1}$ selecting circuit 9a and the $F_{c2}$ selecting circuit 9b in which engine operating condition, namely an engine loading information $L_E$ (obtained from the fuel injection pulse width) and an engine rotational speed information $N_E$ (obtained from the fuel injection pulse interval) are obtained from the fuel injection pulse $T_i$, the required filter characteristics $F_{c1}$ and $F_{c2}$ are selected according to these engine operating conditions from the $F_{c1}$ memory circuit 10a and the $F_{c2}$ memory circuit 10b, appropriate analogue filters corresponding to these filter characteristics are determined, and these filters are provided to the $F_{c1}$ circuit 12a and the $F_{c2}$ circuit 12b.

Figure 3:
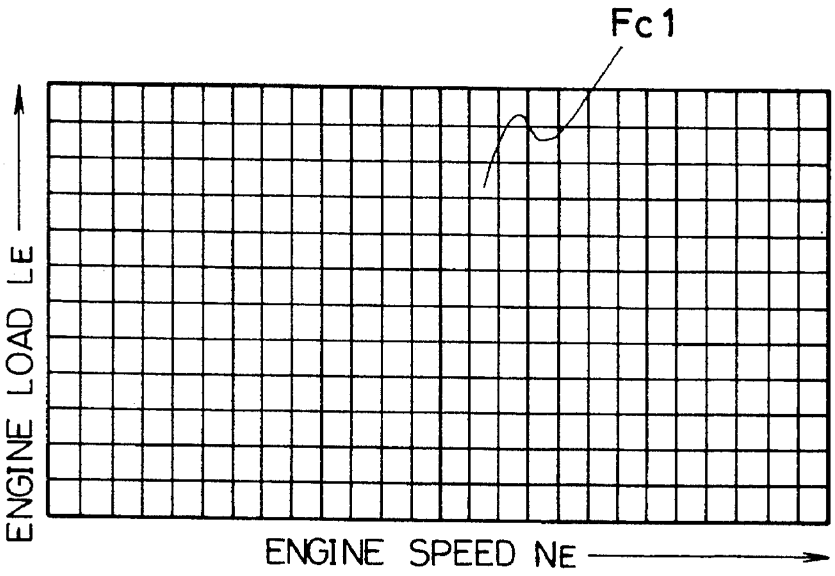

In the $F_{c1}$ memory circuit 10a, as depicted in FIG. 3, the filter characteristics $F_{c1}$ which have been obtained beforehand by experiments or the like are stored on a map parameterizing an engine loading $L_E$ and an engine rotational speed $N_E$. Similarly, in the $F_{c2}$ memory circuit 10b, the filter characteristics $F_{c2}$ which have been obtained beforehand by experiments or the like are stored on a map parameterizing and engine loading $L_E$ and an engine rotational speed $N_E$.

On the other hand, the aforementioned $C_{LMO}$ circuit 3a constitutes a digital filter circuit in which compensation coefficients $C_{110}$ and $C_{210}$ are established as a series of variable values respectively. The compensation coefficients $C_{110}$ are for compensating a delay of time, a deviation of characteristics and a deviation of phase caused during which, a signal outputted from the adaptive filter 2a is generated as a canceling sound from the speaker 5a through the canceling signal processing circuit 4a, then a noise sound is interfered with the canceling sound under the effect of a speaker/microphone transmission characteristic $C_{11}$, then a reduced sound is detected by the error microphone 7a, the detected signal is transmitted to the LMS calculation circuit 6a via the error signal processing circuit 8, and finally calculated therein. Similarly, the compensation coefficient $C_{210}$ are for compensating a delay of time, a deviation of characteristics and a deviation of phase caused during which, a signal outputted from the adaptive filter 2a is generated as a canceling sound from the speaker 5a through the canceling signal processing circuit 4a, then a noise sound is interfered with the canceling sound under the effect of a speaker/microphone transmission characteristic $C_{21}$, then a reduced noise sound is detected by the error microphone 7b, the detected signal is transmitted to the LMS calculation circuit 6a via the error signal processing circuit 8, and finally calculated therein.

Similarly, the aforementioned $C_{LMO}$ circuit 3b is a digital filter circuit in which compensation coefficients $C_{120}$ and $C_{220}$ are established as a series of variable values respectively. The compensation coefficients $C_{120}$ are for compensating a delay of time, a deviation of characteristics and a deviation of phase caused during which, a signal outputted from the adaptive filter 2b is generated as a canceling sound from the speaker 5b through the canceling signal processing circuit 4b, then a noise sound is interfered with the canceling sound under the effect of a speaker/microphone transmission characteristic $C_{12}$, then a reduced noise sound is detected by the error microphone 7a, then the detected signal is transmitted to the LMS calculation circuit 6b via the error signal processing circuit 8, and finally calculated therein. Similarly, the compensation coefficients $C_{220}$ are for compensating a delay of time, a deviation of characteristics and a deviation of phase caused during which, a signal outputted from the adaptive filter 2b is generated as a canceling sound from the speaker 5b through the canceling signal processing circuit 4b, then a noise sound is interfered with the canceling sound under the effect of a speaker/microphone transmission characteristic $C_{22}$, then a reduced noise sound is detected by the error microphone 7b, then the detected signal is transmitted to the LMS calculation circuit 6b via the error signal processing circuit 8, and finally calculated therein.

The $C_{LMO}$ circuit 3a is connected to the $C_{LMO}$ selecting circuit 14a which comprises compensation coefficients selecting means. Further, the $C_{LMO}$ selecting circuit 14a is connected to the $C_{LMO}$ memory circuit 15a which is a memory part of the compensation coefficients selecting means. Similarly, the $C_{LMO}$ circuit 3b is connected to the $C_{LMO}$ selecting circuit 14b which comprises compensation coefficients selecting means. Further, the $C_{LMO}$ selecting circuit 14b is connected to the $C_{LMO}$ memory circuit 15b which is a memory part of the compensation coefficients selecting means.

Furthermore, the $C_{LMO}$ selecting circuits 14a and 14b are supplied with the fuel injection pulse $T_i$ derived from the engine 1. In the $C_{LMO}$ selecting circuits 14a and 14b, the engine operating conditions, that is to say, an engine loading information $L_E$ (obtained from the fuel injection pulse width) and an engine rotational speed information $N_E$ (obtained from the fuel injection pulse interval) are obtained. According to these engine operating conditions, required series of compensation coefficients $C_{LMO}$ ($C_{110}$, $C_{210}$, $C_{120}$ and $C_{220}$: where, subscript L shows a number of error microphone and subscript M does a number of speaker) are selected and established in the $C_{LMO}$ circuits 3a and 3b.

The series of compensation coefficients $C_{LMO}$ stored in the $C_{LMO}$ memory circuits 15a and 15b have been obtained beforehand by experiments or the like such a system identification and a given compensation coefficient is expressed in a series finite impulse response values (for example, 64 taps). When the primary source $P_s$ is inputted to the $C_{LMO}$ circuit 3a, it is subjected to the sum of convolution products with the compensation coefficients, $C_{110}$ and $C_{210}$ and then outputted to the LMS calculation circuit 6a. Similarly when the primary source $P_s$ is inputted to the $C_{LMO}$ circuit, it is subjected to the sum of convolution products with the compensation coefficients $C_{120}$ and $C_{220}$ and then outputted to the LMS calculation circuit 6b.

The LMS calculation circuits 6a and 6b are those for updating the filter coefficients $W_{1(n)}$ and $W_{2(n)}$ of the adaptive filters 2a and 2b based on the error signals from the error microphones 7a and 7b and the signals from the $C_{LMO}$ circuits 3a and 3b respectively, according to a well known LMS algorithm. A filter coefficient $W_{m(n)}$ of the adaptive filter connected to a No. m speaker is updated according to the following equation:

$$W_{mi(n+1)} = W_{mi(n)} - \mu \sum_{L} e_{L(n)} \cdot \sum C_{LiM0} \cdot X_{(n-i)} \quad (1)$$

where, $W_{mi(n+1)}$ is a "i"th filter coefficient after being updated;

$W_{mi(n)}$ is a "i" th filter coefficient to be updated;

$\mu$ is a step size (constant);

$e_{L(n)}$ is a signal from No. L error microphone;

$C_{LiMO}$ is a "i" th $C_{LMO}$; and $X_{(n-i)}$ is a value of the primary source $P_s$ which comes earlier by "i" th.

Next, the filter characteristics $F_{c1}$ and $F_{c2}$ stored in the $F_{c1}$ memory circuit 10a and the $F_{c2}$ memory circuit 10b will be described according to FIG. 4 (a) and FIG. 4 (b).

Figure 4A:
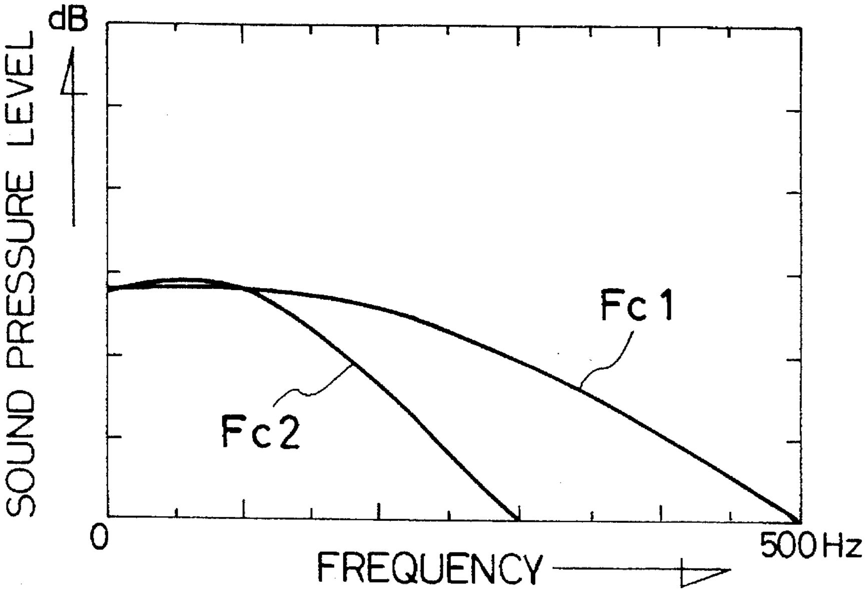
FIG. 4*a* and 4*b* are graphical illustrations the filter characteristics expressed in a frequency domain.
Figure 4B:
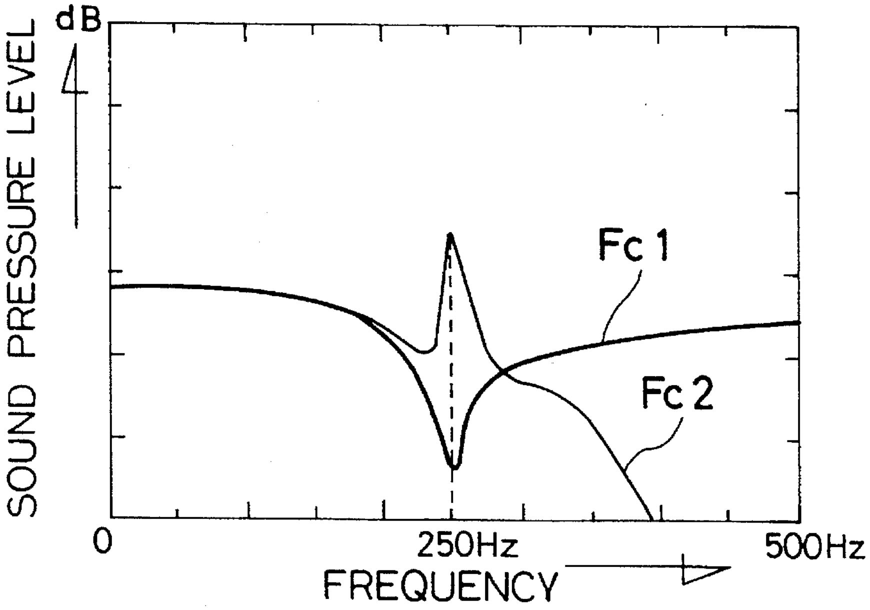

FIG. 4 (a) and FIG. 4 (b) show examples of combination of the filter characteristics $F_{c1}$ and $F_{c2}$ expressed in frequency domain under different operating conditions respectively. Under this operating condition shown in FIG. 4 (a), the combination of filter characteristics $F_{c1}$ indicates characteristics capable of generating a canceling sound with a broad frequency band ranging from 0 to 500 Hz from the speaker 5a which is disposed at the front of the passenger compartment and further the combination of filter characteristics $F_{c2}$ indicates characteristics capable of generating a canceling sound with a low frequency band ranging from 0 to 300 Hz from the speaker 5b which is disposed at the rear of the passenger compartment. That is to say, an example shown in FIG. 4 (a) indicates a combination of filter characteristics in case where there is a noise source with a broad frequency band at the front of the vehicle and there is another noise source with a low frequency band at the rear of the vehicle.

On the other hand, under this operating condition shown in FIG. 4 (b), the combination of filter characteristics $F_{c1}$ indicates characteristics capable of generating a canceling sound with a frequency band ranging from 0 to 500 Hz other than around 250 Hz from the speaker 5a which is disposed at the front of the passenger compartment and further the combination of filter characteristics $F_{c2}$ indicates characteristic capable of generating a canceling sound with a frequency band ranging from 0 to 400 Hz, particularly intensively around 250 Hz from the speaker 5b which is disposed at the rear of the passenger compartment. The example shown in FIG. 4 (b) indicates a combination of filter characteristics in case where there is a noise source composed of a broad frequency band except nearby 250 Hz at the front of the passenger compartment and there is another noise source composed of a frequency band below 400 Hz, having a peak of sound pressure level around 250 Hz at the rear of the passenger compartment.

Since the noise reduction system according to the present invention can raise a degree of contribution of a speaker nearest to the noise source by establishing optimum filter characteristics corresponding to the position of vibration noise sources which changes according to the vehicle operational condition, it can reduce a noise sound effectively over a broad frequency band and further provide a broad coverage of the area where a noise sound is reduced.

Next, it will be described how the noise reduction system according to the above composition is operated.

In the beginning, the operation of the noise reduction will be described about the case where there is a noise source composed of a broad frequency band ranging 0 to 500 Hz at the front of the passenger compartment and there is another noise source composed of a low frequency band ranging from 0 to 300 Hz at the rear of the passenger compartment.

First, a vibration noise of the engine 1 is transmitted to the passenger compartment through engine mountings (not shown) and becomes an internal noise sound therein and intake and exhaust noises of the engine 1 are also transmitted to the passenger compartment. Further, under an operational condition, the engine related vibration noise with a relatively broad frequency band is transmitted into the passenger compartment as a noise sound whose source is located mainly at the front of the passenger compartment and reaches a noise receiving point in the passenger compartment after being multiplied by the body transmission characteristics. On the other hand, the engine related vibration noise with a relatively low frequency band is transmitted into the passenger compartment as a noise sound whose source is located mainly at the rear of the passenger compartment and reaches a noise receiving point in the passenger compartment after being multiplied by the body transmission characteristics.

A fuel injection pulse $T_i$ derived from the engine 1 is inputted to the $F_{c1}$ selecting circuit 9a and $F_{c2}$ selecting circuit 9b. Based on this fuel injection pulse $T_i$ an engine operating condition, namely an engine loading information $L_E$ and an engine rotational speed information $N_E$ are obtained respectively from the pulse width (time) of $T_i$ and the pulse interval thereof. In the $F_{c1}$ selecting circuit 9a, based on these information $L_E$ and $N_E$, a required filter characteristic $F_{c1}$ is selected from a map for the filter characteristic $F_{c1}$ stored in the $F_{c1}$ memory circuit 10a, then an analogue filter corresponding to the selected filter characteristic $F_{c1}$ is selected and established in the filter circuit (hereinafter, referred to as $F_{c1}$ circuit) 12a of the canceling signal processing circuit 4a. At the same time, a series of compensation coefficients $C_{LMO}$ ($C_{110}$ and $C_{210}$) corresponding to the filter characteristic $F_{c1}$ is selected from the $C_{LMO}$ memory circuit 15a and established in the $C_{LMO}$ circuit 3a.

Similarly, in the $F_{c2}$ selecting circuit 9b, based on above information $L_E$ and $N_E$, a required filter characteristic $F_{c2}$ is selected from a map for the filter characteristic $F_{c2}$ stored in the $F_{c2}$ memory circuit 10b, then an analogue filter corresponding to the selected filter characteristic $F_{c2}$ is selected and established in the filter circuit (hereinafter, referred to as $F_{c2}$ circuit) 12b of the canceling signal processing circuit 4b. At the same time, a series of compensation coefficients $C_{LMO}$ ($C_{120}$ and $C_{220}$) corresponding to the filter characteristic $F_{c2}$ is selected from the $C_{LMO}$ memory circuit 15b and established in the $C_{LMO}$ circuit 3b.

The combination of the above filter characteristics $F_{c1}$ and $F_{c2}$ is shown in FIG. 4(a), as an example in which $F_{c1}$ is so determined as to be able to generate a canceling sound over a broad frequency band ranging from 0 to 500 Hz from the speaker 5a disposed at the front of the passenger compartment and $F_{c2}$ is so determined as to be able to generate a canceling sound at a low frequency band ranging from 0 to 300 Hz from the speaker 5b disposed at the rear of the passenger compartment.

The vibration noise source signal (primary source $P_s$) is inputted to the adaptive filters 2a and 2b, and the compensation coefficients synthesizing circuits (hereinafter, referred to as $C_{LMO}$ circuit) 3a and 3b. The primary source $P_s$ may be any signal such as an ignition pulse, a fuel injection pulse, a signal from a crank angle sensor or a shaped and/or processed signal based on these, provided that it has a high correlation with the vibration noise of the engine 1.

The primary source $P_s$ inputted to the adaptive filter 2a is outputted to the canceling signal processing circuit 4a as a canceling signal after being subjected to the sum of convolution products with the filter coefficient $W_{1(n)}$ of the adaptive filter 2a and generated as a canceling sound from the speaker 5a through the D/A converter circuit 11a, the $F_{c1}$ circuit 12a and the AMP circuit 13a in the canceling signal processing circuit 4a.

The canceling sound reaches a front noise receiving point after being subjected to the influence of the speaker/microphone transmission characteristic $C_{11}$, then the result of interference with the noise sound (result of noise reduction) is detected as an error signal by the error microphone 7a and the error signal is inputted to the LMS calculation circuit 6a via the error signal processing circuit 8. On the other hand, the canceling sound reaches a rear noise receiving point after being subjected to the influence of the speaker/microphone transmission characteristic $C_{21}$, then the result of interference with the noise sound is detected as an error signal by the error microphone 7b and the error signal is inputted to the LMS calculation circuit 6a via the error signal processing circuit 8.

Similarly, the primary source $P_s$ inputted to the adaptive filter 2b is outputted to the canceling signal processing circuit 4b as a canceling signal after being subjected to the sum of convolution products with the filter coefficient $W_{2(n)}$ of the adaptive filter 2b and generated as a canceling sound from the speaker 5b through the D/A converter circuit 11b, the $F_{c2}$ circuit 12b and the AMP circuit 13b in the canceling signal processing circuit 4b.

The canceling sound reaches a front noise receiving point after being subjected to the influence of the speaker/microphone transmission characteristic $C_{12}$, then the result of interference with the noise sound (result of noise reduction) is detected as an error signal by the error microphone 7a and the error signal is inputted to the LMS calculation circuit 6b via the error signal processing circuit 8. On the other hand, the canceling sound reaches a rear noise receiving point after being subjected to the influence of the speaker/microphone transmission characteristic $C_{22}$, then the result of interference with the noise sound is detected as an error signal by the error microphone 7b and the error signal is inputted to the LMS calculation circuit 6b via the error signal processing circuit 8.

The primary source $P_s$ inputted to the $C_{LMO}$ circuit 3a is subjected to the sum of convolution products with a series of compensation coefficients $C_{110}$ and $C_{210}$ which have been already established in the $C_{LMO}$ circuit 3a respectively and outputted to the LMS calculation circuit 6a. Then, in the LMS calculation circuit 6a, the correction amount of the filter coefficient $W_{1(n)}$ for the adaptive filter 2a is obtained from the error signals from the error microphone 7a and 7b and from the primary source $P_s$ synthesized in the $C_{LMO}$ circuit 3a, and the filter coefficient $W_{1(n)}$ is updated.

Similarly, the primary source $P_s$ inputted to the $C_{LMO}$ circuit 3b is subjected to the sum of convolution products with a series of compensation coefficients $C_{120}$ and $C_{220}$ which have been already established in the $C_{LMO}$ circuit 3b respectively and outputted to the LMS calculation circuit 6b. Then, in the LMS calculation circuit 6b, the correction amount of the filter coefficient $W_{2(n)}$ for the adaptive filter 2b is obtained from the error signals from the error microphone 7a and 7b and from the primary source $P_s$ synthesized in the $C_{LMO}$ circuit 3b, and the filter coefficient $W_{2(n)}$ is updated.

Next, the operation of the noise reduction system according to the present invention will be described about the case where, as a result of the change of the engine operating condition, noise sources are changed to like in FIG. 4 (*b*). This case indicates where there is a noise source composed of a broad frequency band except for around 250 Hz at the front of the passenger compartment and there is another noise source composed of a frequency band below 400 Hz, having a peak sound pressure level around 250 Hz at the rear of the passenger compartment.

In the $F_{c1}$ selecting circuit 9a, based on those parameters $L_E$ and $N_E$ which are contained in this engine operating condition, a required filter characteristic $F_{c1}$ is selected from a map for the filter characteristic $F_{c1}$ stored in the $F_{c1}$ memory circuit 10a, then an analogue filter corresponding to the selected filter characteristic $F_{c1}$ is selected and established in the $F_{c1}$ circuit 12a of the canceling signal processing circuit 4a. At the same time, a series of compensation coefficients $C_{LMO}$ ($C_{110}$ and $C_{210}$) corresponding to the filter characteristic $F_{c1}$ is selected from the $C_{LMO}$ memory circuit 15a and established in the $C_{LMO}$ circuit 3a.

Similarly, in the $F_{c2}$ selecting circuit 9b, based on above parameters $L_E$ and $N_E$, a required filter characteristic $F_{c2}$ is selected from a map for the filter characteristic $F_{c2}$ stored in the $F_{c2}$ memory circuit 10b, then an analogue filter corresponding to the selected filter characteristic $F_{c2}$ is selected and established in the $F_{c2}$ circuit 12b of the canceling signal processing circuit 4b. At the same time, a series of compensation coefficients $C_{LMO}$ ($C_{120}$ and $C_{220}$) corresponding to the filter characteristic $F_{c2}$ is selected from the $C_{LMO}$ memory circuit 15b and established in the $C_{LMO}$ circuit 3b.

The combination of the above filter characteristics $F_{c1}$ and $F_{c2}$ is shown in FIG. 4 (*b*), as an example in which $F_{c1}$ is so determined as to be able to generate a canceling sound with a frequency band ranging from 0 to 500 Hz, excepting one around 250 Hz from the speaker 5a disposed at the front of the passenger compartment and $F_{c2}$ is so determined as to be able to generate a canceling sound at a frequency band ranging from 0 to 400 Hz, especially generate intensively at a frequency around 250 Hz, from the speaker 5b disposed at the rear of the passenger compartment.

Further, the primary source $P_s$ from the engine 1 is inputted to the adaptive filters 2a and 2b, and the $C_{LMO}$ circuits 3a and 3b, then further noise reduction processings are carried out as in the case of the operating condition mentioned before.

Thus, as described hereinbefore, the noise reduction system according to the present invention can control a degree of contribution of the canceling sound in accordance with different noise source locations which have been obtained beforehand in such a manner as positively generating a canceling sound from the speaker disposed at the noise source side and, on the other hand, attenuating the noise reduction by the speaker disposed at the remote position from the noise source, Therefore, differently from the prior art in which each speaker always generates the same level of canceling sound, the noise reduction system according to the present invention can reduce noise sounds in a broad area including not only an area adjacent to the microphone but also an area away therefrom, Furthermore, in this noise reduction system, since the convergence of filter coefficients of the adaptive filter is rapidly performed by the LMS algorithm, an excellent response can be obtained even at the transient operating conditions, In this embodiment, two cases where a noise source location is different have been described, but in other cases where a noise source location moves otherwise, the noise reduction control is also performed on the same principle.

Further, in a vehicle whose interior transmission characteristics are such that the noise source locations are not changed even when an operating condition is changed, the canceling signal processing means may comprise only a canceling signal processing circuit having a fixed filter characteristic and in this case each series of compensation coefficients $C_{LMO}$ is also fixed.

Further, in this embodiment, the analogue filter of the canceling signal processing circuit serves both as a regular filter circuit for shaping a wave and passing a particular frequency band, and a particular filter circuit for establishing a required frequency characteristic corresponding to the noise source location, however it may be possible to separate the analogue filter into the regular filter part for shaping wave and the particular filter part for establishing a required frequency characteristic and to displace this particular filter circuit with a digital filter so as to directly control by digital signals from the $F_{c1}$ selecting circuit.

Further, this embodiment has been described as an example of the internal noise reduction system employing the MEFX-LMS algorithm composed of two channels, however the noise reduction system according to the present invention can be applied to the internal noise reduction system employing the MEFX-LMS algorithm composed of four channels, for example. Further in this embodiment, each channel consists of one speaker and one microphone, however two or more speakers and two or more microphones may be possible in one channel.

Furthermore, in this embodiment a fuel injection pulse $T_i$ is used to detect the engine operating condition (engine loading information $L_E$ and engine rotational speed information $N_E$), however other means for detecting these information may be available, such that engine loading information is obtained from the amount of induction air or the throttle opening degree and engine rotational speed information from pulse signals of the crank angle sensor or the cam angle sensor.

Next, referring to FIG. 5 and FIG. 6, the result of experiments which have been performed on the chassis dynamometer using an actual vehicle, will be described.

Figure 5:
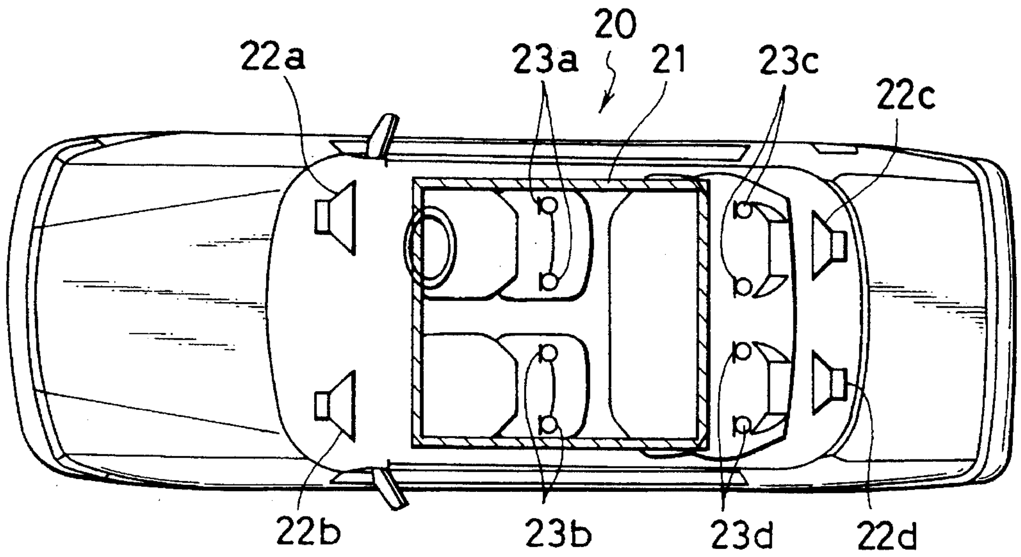
FIG. 5 is a graphical illustration for showing an arrangement of speakers and microphones on a vehicle, when a confirmatory test was performed.

FIG. 5 is a graphical illustration for showing an arrangement of speakers and microphones on a vehicle, when a confirmatory test was performed. Further, FIG. 6 (*a*) is an illustration for showing the result of a noise reduction according to the present invention and FIG. 6 (*b*) is an illustration for showing the result of a noise reduction according to the prior art using the MEFX-LMS algorithm as commonly known.

Referring now to FIG. 5, numeral 20 denotes a vehicle by which running tests were performed. A measuring area 21 for measuring a sound pressure and evaluating a noise reduction effect therein was established on a horizontal plane as high as the position of passenger's ears. Further, numeral **22*a* indicates a speaker (speaker No. 1) for generating a canceling sound disposed at the front of the driver's seat, numeral 22*b* does a speaker (speaker No. 2) for generating a canceling sound disposed at the front of the front passenger's seat, numeral 22*c* does a speaker (speaker No. 3) for generating a canceling sound disposed at the rear of the right rear passenger's seat and numeral 22*d*** does a speaker (speaker No. 4) for generating a canceling sound disposed at the rear of the left rear passenger's seat.

Further, numeral **23*a* denotes an error microphone (microphone No. 1) installed at the head-rest of the driver's seat, numeral 23*b* does an error microphone (microphone No. 2) installed at the head-rest of the front passenger's seat, numeral 23*c* does an error microphone (microphone No. 3) installed at the head-rest of the right rear passenger's seat and numeral 23*d* does an error microphone (microphone No. 4**) installed at the head-rest of the left rear passenger's seat.

The noise reduction system used for or this experiment employs the MEFX-LMS algorithm comprising four speakers and four microphones. For example, when it is supposed that there is a vibration noise of 327 Hz at the front of the vehicle, the effect of noise reduction was compared with respect to two cases, one is a case where each channel of the internal noise reduction system is operated likewise independently and another is a case where each channel is operated interconnectedly, that is to say, raising a degree of contribution of the canceling sound from the front speakers **22*a* and 22*b*, and decreasing a degree of contribution of the canceling sound from the rear speakers 22*c* and 22*d***.

Figure 6A:
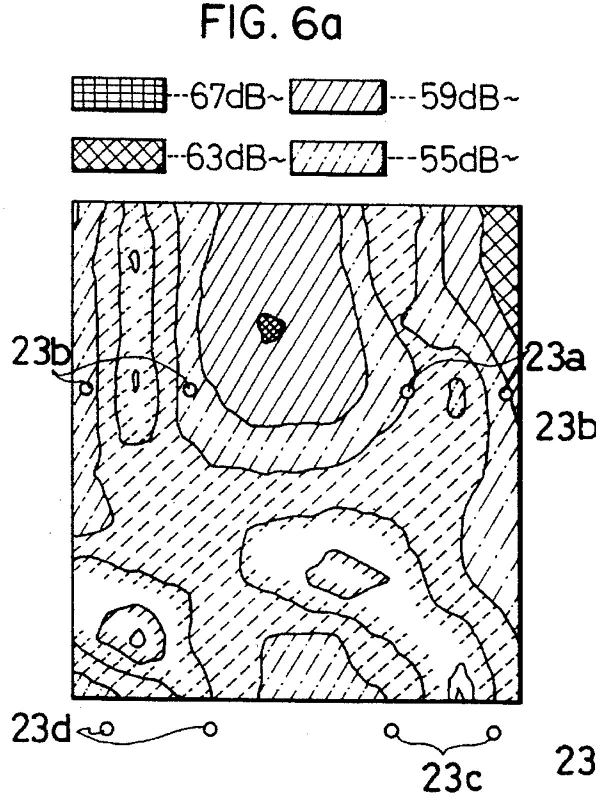
FIG. 6 (*a*) is an illustration for showing the result of a noise reduction according to the present invention.
Figure 6B:
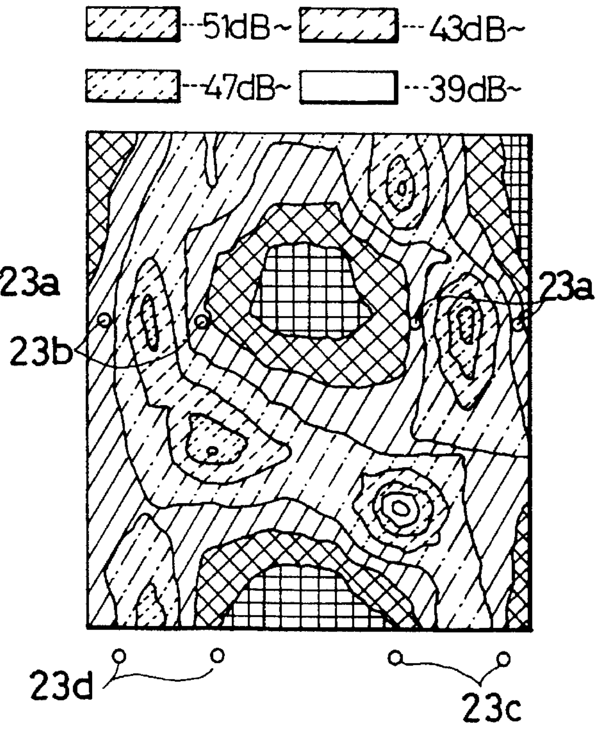
Figure 7:
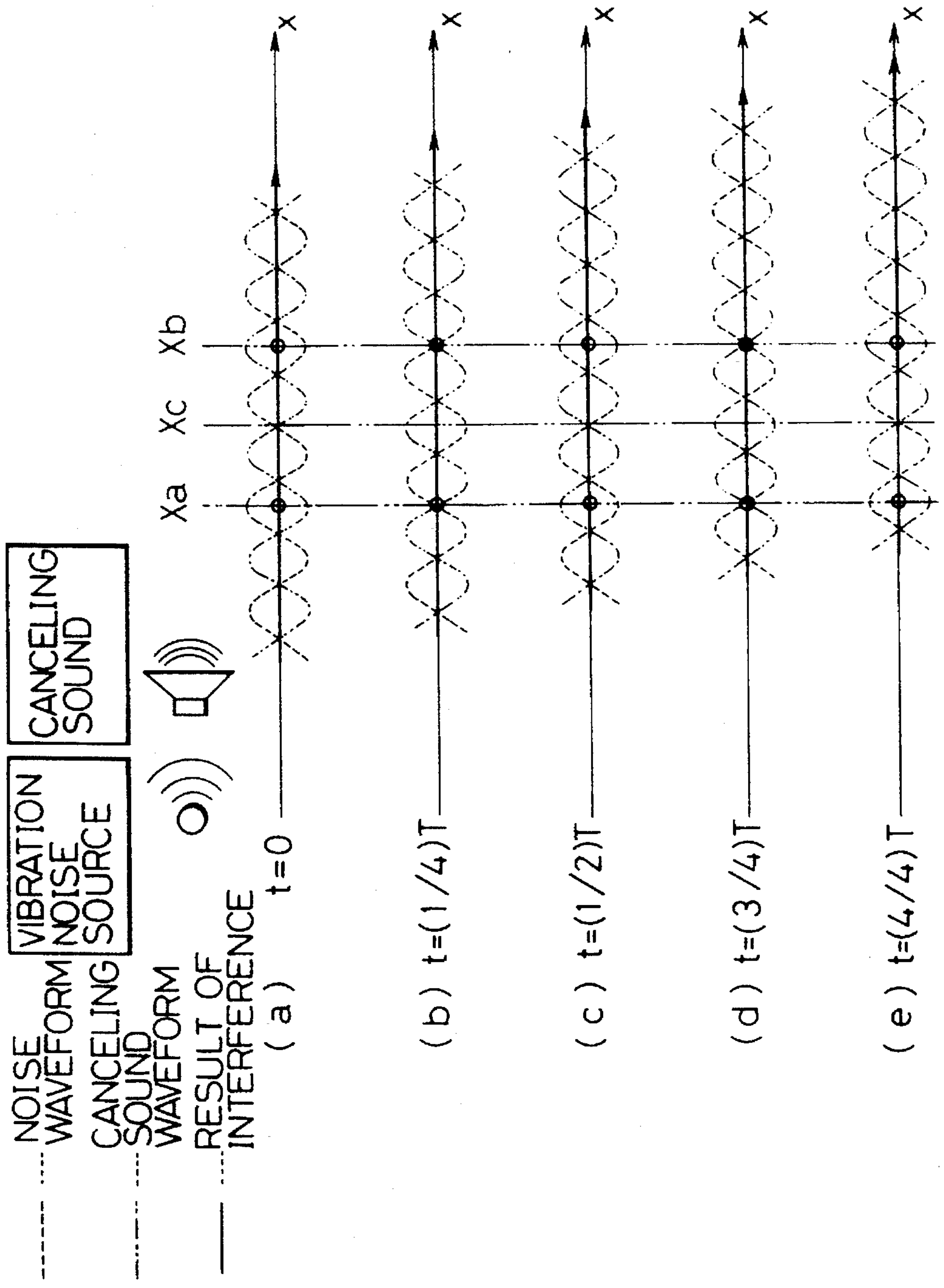
FIG. 7 and FIG. 8 are illustrations for explaining the difference of features in noise reduction between the case where the canceling sound comes from the same direction as a noise source and the case where the canceling sound comes from an opposite direction to a noise source.
Figure 8:
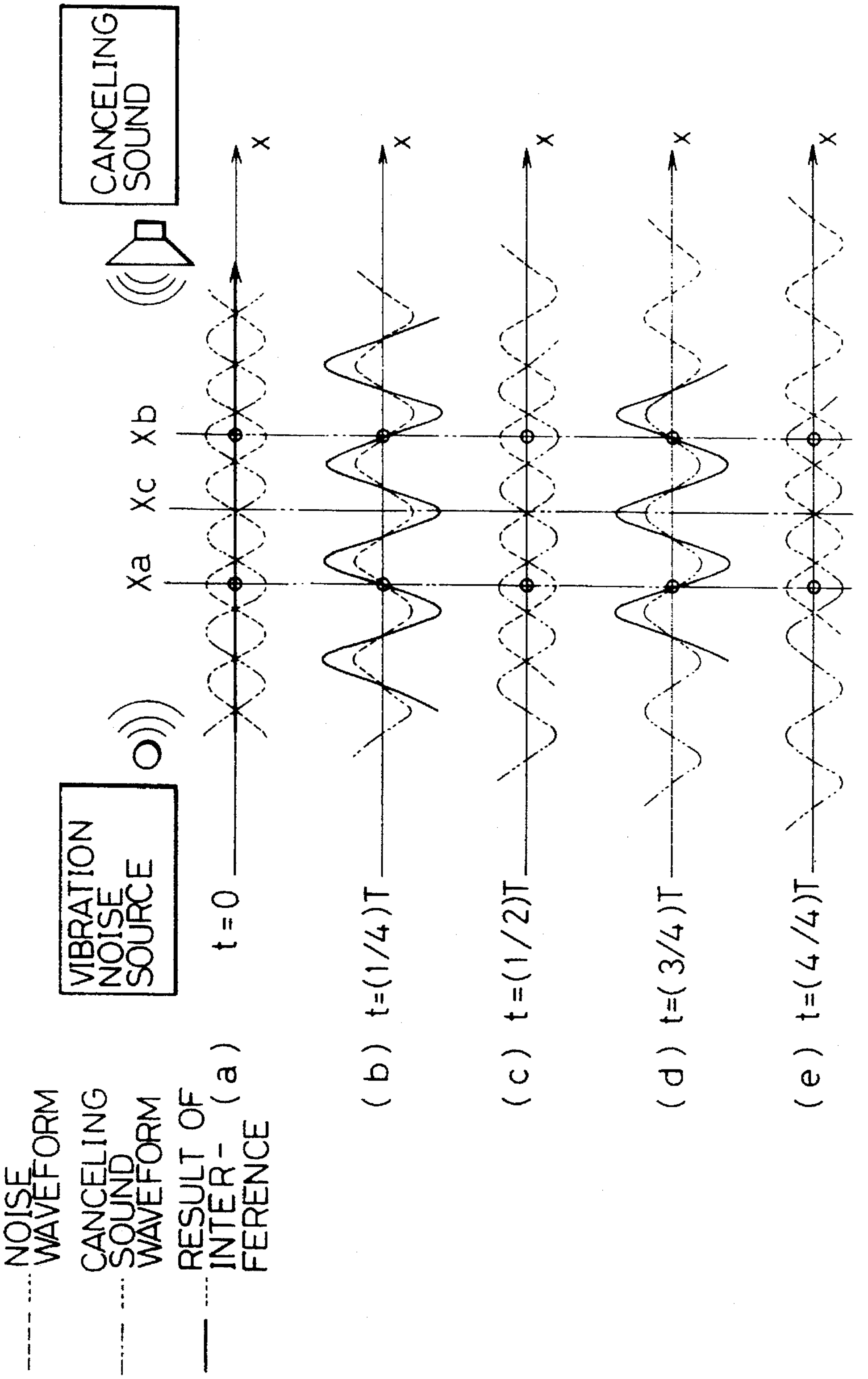

The result of this comparison indicates, as shown in FIG. 6 (*b*), that the noise reduction areas are formed in the vicinity of the error microphones **23*a*, 23*b*, 23*c* and 23*d* respectively, however that noise is worsened at the area between the error microphone 23*a* and the error microphone 23*b*, and also the area between the error microphone 23*c* and the error microphone 23*d***. This suggests that passengers may feel uncomfortable when they move their heads.

On the other hand, as shown in FIG. 6 (*a*), the noise reduction control according to the present invention indicates that a broad noise reduction area is formed all over the measuring area 21.

While the presently preferred embodiment of the present invention has been shown and described, it is to be understood that this disclosure is for the purpose of illustration and that various changes and modifications may be made without departing from the scope of the invention as set forth in the appended claims.

We claim:

1. A vehicle internal noise reduction system for a passenger compartment in an automobile vehicle having, an internal combustion engine mounted on said vehicle for generating a primary source signal relating to engine vibration thereof, a fuel injector for injecting fuel into a cylinder of said engine and for generating a fuel injection pulse signal, a plurality of channels responsive to an operating condition signal of an engine and an electronic control unit for controlling said engine and said fuel injector, said system comprising:

a plurality of canceling signal selecting means responsive to said fuel injection pulse signal for selecting a filter characteristic corresponding to each engine operating condition and for producing a first selecting signal;

a plurality of compensation coefficient selecting means responsive to said fuel injection pulse signal for selecting a filter characteristic corresponding to each engine operating condition and for producing a second selecting signal;

a plurality of input signal compensating means responsive to said primary source signal and said second selecting signal for synthesizing a compensation coefficient and for generating a compensation coefficient signal;

a plurality of coefficient updating means responsive to said compensation coefficient signal for updating said compensation coefficient depending on said engine operating condition and for outputting a correction signal;

a plurality of canceling signal synthesizing means responsive to said primary source signal and said correction signal for correcting a canceling signal and for producing a corrected signal;

a plurality of canceling signal processing means responsive to said first selecting signal and said corrected signal for synthesizing a vibration noise source signal from said engine and said fuel injector into a canceling signal and for outputting a canceling signal;

a plurality of canceling sound generating means responsive to said canceling signal for changing into an analog signal in order to cancel a vibration noise sound in said compartment and for generating a canceling sound so as to reduce said noise at any point of said compartment for a wide range of noise frequencies;

a plurality of error signal detecting means responsive to said analog signal for detecting a reduced noise sound at a plurality of receiving points as an error signal and for generating an error signal; and said coefficient updating means for receiving said error signal in addition to said compensation coefficient signal for updating said compensation coefficient so as to effectively reduce said noise at any point in said compartment by a nearest combination of said canceling sound generating means and said detecting means with an optimum canceling frequency range.

2. The vehicle internal noise reduction system according to claim 1, wherein said each channel comprises:

operational conditions detecting means for detecting said operating condition signal;

compensation coefficients memory means for storing compensation coefficients;

compensation coefficients selecting means responsive to said operating condition signal for selecting a compensation coefficient from among said compensation coefficients stored in said compensation coefficients memory means;

input signal compensating means for synthesizing said vibration noise source signal with said compensation coefficient selected by said compensation coefficients selecting means;

canceling signal synthesizing means for synthesizing said vibration noise source signal with a filter coefficient;

filter characteristics memory means for storing predetermined filter characteristics;

filter characteristics selecting means responsive to said operating condition signal for selecting a filter characteristic from among said filter characteristics stored in said characteristics memory means;

canceling signal processing means for processing said vibration noise source signal synthesized by said canceling signal synthesizing means with said filter characteristic and for outputting a canceling signal;

canceling sound generating means responsive to said canceling signal for generating said canceling sounds from a speaker so as to cancel said noise sound within the passenger compartment;

error signal detecting means for detecting a state of noise reduction by said canceling sounds and for generating an error signal; and filter coefficients updating means responsive to said error signal for calculating said filter coefficient based on said vibration noise source signal synthesized by said input signal compensating means and a preceding filter coefficient and for transmitting said filter coefficient to said canceling signal synthesizing means.

3. The vehicle internal noise reduction system according to claim 1, wherein said each channel includes at least one speaker and at least one microphone.

4. The vehicle internal noise reduction system according to claim 2, wherein said operating condition signal is a combination of an engine loading and an engine rotational speed.

5. The vehicle internal noise reduction system according to claim 2, wherein said compensation coefficient is a predetermined coefficient for compensating at least a delay of time, an effect of transmission characteristics between a speaker and a microphone and a deviation of phase.

6. The vehicle internal noise reduction system according to claim 2, wherein said compensation coefficient is expressed in a series of figures and stored on a map parameterizing a combination of an engine loading and an engine rotational speed.

7. The vehicle internal noise reduction system according to claim 2, wherein said filter characteristic includes at least a filter characteristic by which an intensity of said canceling sounds is controlled in accordance with a location of a noise source.

8. The vehicle internal noise reduction system according to claim 2, wherein said filter characteristic is independently predetermined for said each channel so as to selectively control an intensity of canceling sounds in accordance with a location of a noise source.

9. The vehicle internal noise reduction system according to claim 2, wherein said filter characteristic is stored on a map parameterizing a combination of an engine loading and an engine rotational speed.

10. The vehicle internal noise reduction system according to claim 1, wherein said vibration noise source signal is derived from an ignition pulse.

11. The vehicle internal noise reduction system according to claim 1, wherein said vibration noise source signal is derived from a fuel injection pulse.

12. The vehicle internal noise reduction system according to claim 1, wherein said vibration noise source signal is derived from a signal detected by a crank angle sensor.

13. The vehicle internal noise reduction system according to claim 1, wherein said vibration noise source signal is derived from an engine vibration noise.

14. The vehicle internal noise reduction system according to claim 1, wherein said operating condition signal is a fuel injection pulse.

15. The vehicle internal noise reduction system according to claim 4, wherein said engine loading is obtained from a fuel injection pulse width and said engine rotational speed is obtained from a fuel injection pulse timing.

16. The vehicle internal noise reduction system according to claim 4, wherein said engine loading is obtained from a throttle opening degree.

17. The vehicle internal noise reduction system according to claim 4, wherein said engine loading is obtained from an amount of induction air.

18. The vehicle internal noise reduction system according to claim 4, wherein said engine rotational speed is obtained from a signal detected by a crank angle sensor.

19. The vehicle internal noise reduction system according to claim 4, wherein said engine rotational speed obtained from a signal detected by a cam angle sensor.

* * * * *